US007109488B2

(12) United States Patent
Milton

(10) Patent No.: US 7,109,488 B2
(45) Date of Patent: Sep. 19, 2006

(54) MULTI-COLOR INFRARED IMAGING DEVICE

(75) Inventor: A. Fenner Milton, Washington, DC (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 183 days.

(21) Appl. No.: 10/787,907

(22) Filed: Feb. 26, 2004

(65) Prior Publication Data

US 2005/0189492 A1  Sep. 1, 2005

(51) Int. Cl.
*H01L 25/065* (2006.01)
*H01L 31/0232* (2006.01)
*H01L 27/146* (2006.01)
*G01J 5/28* (2006.01)
*G01J 3/51* (2006.01)

(52) U.S. Cl. ............ 250/332; 250/339.02; 250/370.08; 257/440; 257/443

(58) Field of Classification Search ................ 250/332, 250/339.02, 370.08; 257/440, 443, E27.138
See application file for complete search history.

(56) References Cited

U.S. PATENT DOCUMENTS

| 4,596,930 A | * | 6/1986 | Steil et al. .................... 250/332 |
| 5,157,258 A | * | 10/1992 | Gunning et al. ........ 250/339.02 |
| 5,258,618 A | * | 11/1993 | Noble ......................... 250/332 |
| 5,444,236 A | * | 8/1995 | Ludington et al. ........ 250/208.1 |
| 5,479,032 A |  | 12/1995 | Forrest et al. .............. 257/190 |
| 5,552,603 A |  | 9/1996 | Stokes ...................... 250/338.4 |
| 5,751,005 A | * | 5/1998 | Wyles et al. ........... 250/370.06 |
| 6,104,046 A |  | 8/2000 | Borenstain .................. 257/185 |
| 6,236,508 B1 | * | 5/2001 | Stapelbroek ............. 250/338.4 |
| 6,469,358 B1 |  | 10/2002 | Martin ........................ 257/440 |
| 6,495,830 B1 |  | 12/2002 | Martin .................. 250/339.02 |
| 6,521,967 B1 |  | 2/2003 | Bandara et al. ............. 257/440 |

* cited by examiner

*Primary Examiner*—David Porta
*Assistant Examiner*—Frederick F. Rosenberger
(74) *Attorney, Agent, or Firm*—Andrew Romero

(57) ABSTRACT

A multi-color IR imaging device includes optics that direct mid-wave infrared (MWIR) and long-wave infrared (LWIR) radiation onto a focal plane array having LWIR and MWIR detection layers. Pixel groups that include at least one first pixel and one second pixel are defined on the focal plane array, and a first filter and a second filter which form part of an inhomogeneous filter is placed over the respective first and second pixels in a checkerboard pattern, in close proximity to the detection layers. This allows MWIR radiation in M band, and LWIR radiation in an $L_1$ band to pass therethrough and illuminate the first pixels, and M, $L_1$, and a separate LWIR band designated $L_2$ to pass therethrough and illuminate the second pixels. To simultaneously image both MWIR and LWIR, the focal plane array is placed at a predetermined distance from the optics so that the MWIR spot size covers a single pixel and the LWIR spot size is about the same area as the area of a group of two first pixels and two second pixels. Since all pixels receive the M band, half of the pixels in the group receive the $L_1$ band, and the other half receives the $L_2$ band, three bands can be generated. This allows simultaneous imaging of MWIR and two sub-bands of the LWIR from the same point in space.

11 Claims, 3 Drawing Sheets

MULTI-COLOR INFRARED IMAGING DEVICE

GOVERNMENT INTEREST

The invention described herein may be manufactured, used, sold, imported, and/or licensed by or for the Government of the United States of America.

FIELD OF THE INVENTION

The present invention applies generally to infrared (IR) imaging systems. More particularly, the present invention applies to an IR imaging system that provides for simultaneous collection of IR image data in two long-wave infrared (LWIR) bands and one mid-wave infrared (MWIR) band without significant loss of spatial resolution of the received image.

BACKGROUND OF THE INVENTION

Infrared (IR) imaging sensors for displaying information are well known in the prior art. For some applications, IR sensors are used to distinguish an object from its background, and image data from several spectral bands is often useful for this application. The IR spectrum can be divided into mid-wave infrared (MWIR) and long-wave infrared (LWIR) bands, and prior art IR imaging systems typically are capable of displaying IR radiation in only one spectral band at any given time. For some applications, it is desirable to be able to simultaneously observe IR data in two LWIR bands and one MWIR band with the same sensor.

One way to observe multiple bands with the same sensor is to use a filter wheel. For this structure, a filter having sequential frame filters is provided. As the wheel is rotated, the different filter frames pass over the substrate, and different bands of IR radiation pass through and illuminate the substrate. Sequential frames can therefore collect image data in different bands. The disadvantage of this method, however, is that the IR image cannot be collected simultaneously in more than one band. Because of this, if there is a large relative motion between the imaged IR object and the sensor platform, this method causes a "blending" or "blurring" of the different IR bands. Thus, this method of providing a multi-color IR display is not particularly useful if either the imaged object or platform sensor, or both, is in motion.

Another way to collect IR information in a multi-band format is to provide an IR focal plane array (FPA) having multiple detector layers with multiple outputs at each pixel that correspond to the desired bands. U.S. Pat. No. 5,552,603, which issued to Burnham Stokes for an invention entitled "Bias And Readout For Multicolor Quantum Well Detectors", discloses a device with this type of structure. For the invention as described by Stokes, three separate outputs are generated by assigning a detector layer to each desired band output and then electronically biasing each detector layer through a plurality of conductive layers that are interleaved among the three detector layers to be biased.

The result of the invention of Stokes, however, is an unnecessarily complex structure with three detection layers, each one optimized for a different band. Stated differently, and as mentioned above, the device recited by Stokes requires the deposition of extra detector and deposition layers and does not solve the ease of manufacturing question, in that it would also be very difficult and expensive to build. What is desired is an IR sensor that can simultaneously detect and display multiple "colors" (two from the LWIR and one from the MWIR band) from the same point in space without the complexity of a three detection layer structure. A focal plane array with two detection layers is much easier to fabricate than one with three layers.

In light of the above, it is an object of the present invention to provide an IR imaging device that can collect multi-band images. Yet another object of the present invention is to provide an IR imaging device that can simultaneously collect images in three distinct spectral bands. Another object of the present invention is to provide an IR imaging sensor that collects one band in the MWIR and two bands in the LWIR without loss of spatial resolution of the imaged object. It is another object of the present invention to use the diffraction effects of the LWIR in combination with two detection layers and an inhomogeneous (checker board or striped) filter to provide a three-color IR system. It is another object of the present invention to provide an IR imaging device that is relatively easy to manufacture in a cost-effective manner.

SUMMARY OF THE INVENTION

A multi-color infrared (IR) imaging device in accordance with the present invention includes a focal plane array with a mid-wave infrared (MWIR) and a long-wave infrared (LWIR) detection layer. The focal plane array includes plurality of pixels formed on the surface, and the device includes optics for receiving MWIR and LWIR radiation and directing the MWIR and LWIR radiation simultaneously in focus onto the focal plane array.

A special inhomogeneous filter is placed in close proximity to the detection layer over the focal plane array such that all pixels receive the MWIR radiation (M) but neighboring pixels receive different portions of the LWIR band ($L_1$ or $L_2$). The inhomogeneous filter can be in a checkerboard or striped pattern and, for practical reasons, $L_2$ may be totally separate from $L_1$ or just be a wider band that includes $L_1$ (in which case a differencing amplifier can be used to extract $L_2-L_1$ from the electrical output from neighboring pixels).

To simultaneously image both MWIR and two bands in the LWIR, the focal plane array is placed at the focal point of the optics. The optics must be designed such that the focal length of the optics is the same for MWIR and LWIR radiation. Specifically, the predetermined distance is chosen such that the diffraction limited spot size for MWIR radiation matches the pixel size. Because of diffraction effects, even for well designed optics, the LWIR diffraction limited spot size will be larger and cover a group of 4 pixels while the MWIR spot size only covers one pixel.

Since each pixel receives the M band and two of the four pixels in the group receive the $L_1$ band, and two other pixels in the same group receive the $L_2$ band, three bands can be imaged simultaneously. The result is a device that collects IR images in two LWIR bands and one MWIR band from the same point in space and at the same time, without any sacrifice in spatial resolution of the MWIR image or the LWIR image.

BRIEF DESCRIPTION OF THE DRAWINGS

The novel features of this invention will be best understood from the accompanying drawings, taken in conjunction with the accompanying description, in which similar characters refer to similar parts, and in which.

WRITTEN DESCRIPTION OF THE PREFERRED EMBODIMENT

Throughout this specification, the terms IR, MWIR, LWIR, as well as the M, $L_1$ and $L_2$ are used. The term IR refers to infrared radiation, or that portion of the electromagnetic spectrum having a wavelength between 0.8 and 100 microns ($\lambda$=0.8–100 µm). The term MWIR refers to mid-wave infrared radiation, or that portion of the IR spectrum between three to seven micrometers ($\lambda$=3–7 µm), and the M band refers to MWIR between three to five micrometers ($\lambda$=3–5 µm). The term LWIR refers to long-wave infrared radiation LWIR radiation in the range of seven to ten microns ($\lambda$=7–12 µm). Within the LWIR range, two bands are defined, the $L_1$ band ($\lambda$=7–9 µm) and the $L_2$ band ($\lambda$=9–10 µm). Within the respective MWIR and LWIR ranges, other M, $L_1$ and $L_2$ bands can also be defined to practice the invention as hereinafter described.

Figure 1:
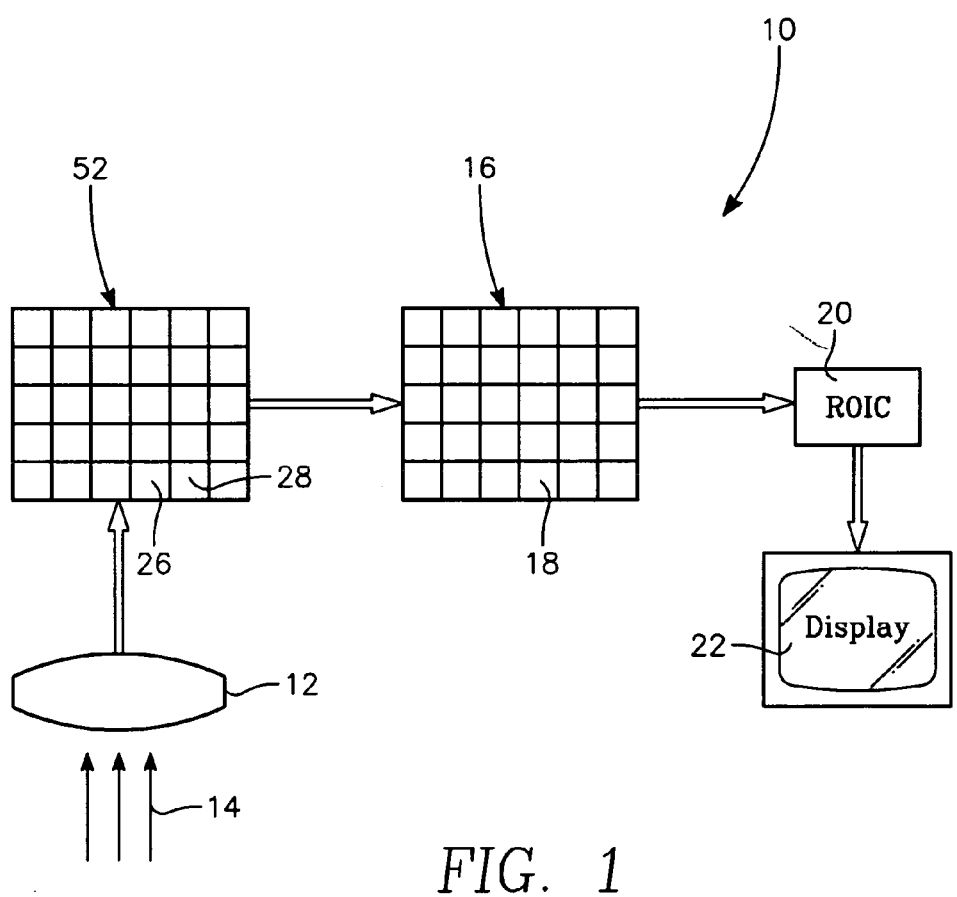
FIG. 1 is a schematic of an infrared (IR) imaging device.

Referring initially to the FIG. 1, the multi-color IR imaging device of the present invention is shown and is generally designated by reference character 10. The device 10 includes optics 12 for receiving IR radiation energy, designated by arrows 14. The optics receives the IR radiation and directs the energy onto an inhomogeneous filter 52 and then onto focal plane array 16 of detector elements, or pixels 18. The pixels create a very detailed map or "picture" of the radiation received from the scene. The map created by the detector elements is translated into electric impulses by a read only integrated circuit board (ROIC) 20. ROIC 20 sends the information to a display 22, where it appears as an image of various shades of gray depending on the intensity of the received infrared radiation. The combination of all the impulses from all of the pixels creates the image.

Figure 2:
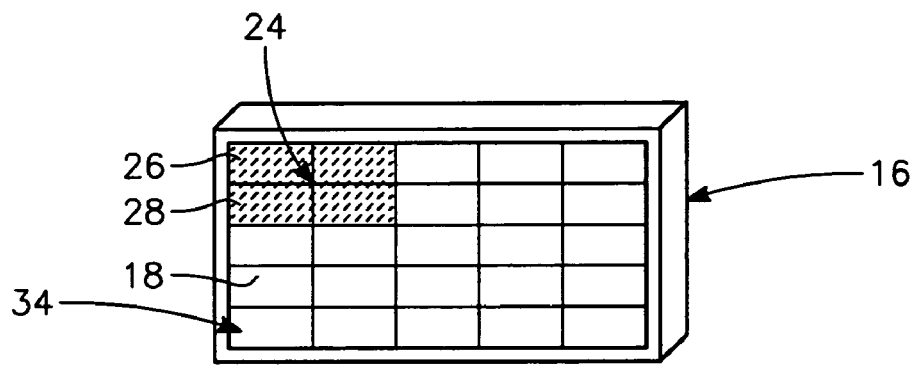
FIG. 2 is a front elevational view of the focal plane array shown in FIG. 1.

As shown in FIG. 2, the pixels 18 in focal plane array 16 are arranged in a grid. The pixels can be grouped so that they define a plurality of pixel groups 24 (the pixel group is indicated by the pixels in FIG. 2 that have dashed lines), with each pixel group 24 further including at least a first pixel 26 and a second pixel 28.

Figure 3A:
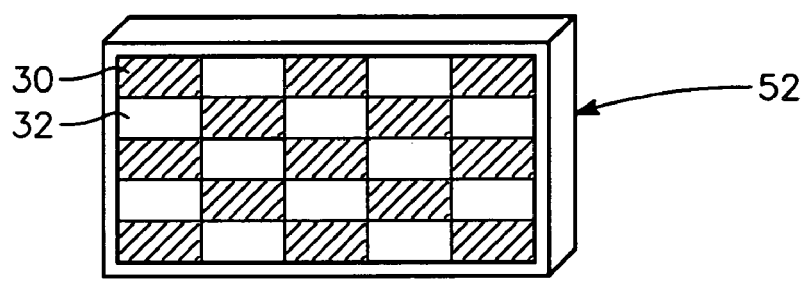
FIG. 3A is a front elevational view of the inhomogeneous filter shown in FIG. 1.

The inhomogeneous filter 52 shown in FIG. 3A includes a first pixel filter 30 that will pass IR in the M and $L_1$ bands, and a second filter pixel 32 that will pass M, $L_1$ and $L_2$ bands. The size and shape of both the first pixel filter 30 and second pixel filter 32 both correspond to the size and shape of the pixels in the FPA. With this structure, when the inhomogeneous filter is placed on top of focal plane array 16 in close proximity, there is alignment between both patterns of pixel filters and pixels.

Figure 3B:
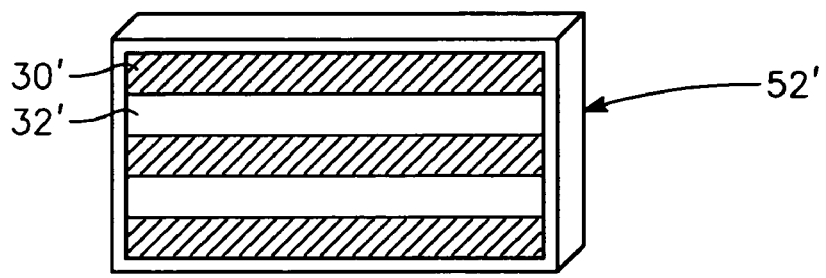
FIG. 3B is a front elevational view of an alternate embodiment of the inhomogeneous filter shown in FIG. 1.

In an alternative embodiment of the invention, and as shown in FIG. 3B, inhomogeneous filter 52' can have a striped pattern comprising alternating first stripe filter 30' and second stripe filter 32'. The stripes are chosen so that each strip corresponds to a row 34 of pixels 18 in focal plane array 16 when inhomogeneous filter 52' is placed in closed proximity to the focal plane array. With this configuration, alternate stripes pass M and $L_1$, and M, $L_1$ and $L_2$ bands to the focal plane array.

Figure 4:
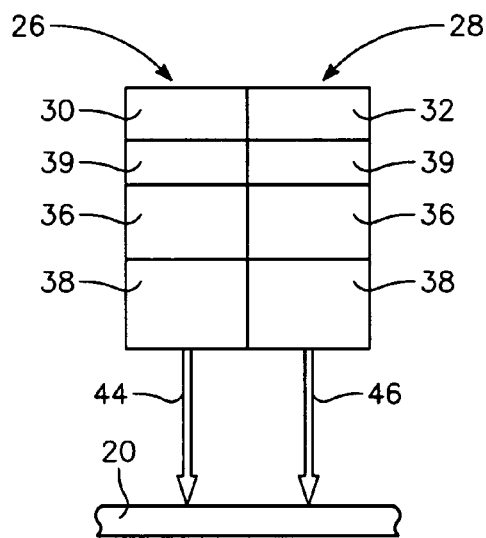
FIG. 4 is a greatly enlarged cross-sectional view of the focal plane array and filter shown in FIG. 1.

Referring primarily now to FIG. 4, the structure of the first and second pixels in an exemplary pixel group is shown in greater detail. Specifically, each first pixel 26 and second pixel 28 in the group includes a mid-wave detection layer 36 and a long-wave detection layer 38. Preferably, the mid-wave detector layer can detect MWIR while long-wave detection layer 38 can detect LWIR in a manner known in the art. Within the pixel groups, each pixel is electronically connected and provides an output to the read only integrated circuit (ROIC) 20. Each pixel also includes a substrate stratum 39 upon which the mid-wave detection layer and the long wavelength detection layer are grown by epitaxial techniques. This substrate layer must be thinned to allow the first and second pixel filters 30, 32 and the detection layers to be in close proximity.

In the preferred embodiment, the mid-wave detection layer and long-wave detection layer are manufactured from a Mercury/Cadmium/Telluride (MCT) material combination. It is to be appreciated, however, that other materials could be used, provided the layers detect IR radiation within the desired MWIR and LWIR ranges. The substrate stratum 39 is preferably made of a Cadmium/Zinc/Telluride (CZT) material combination, although an Aluminum/Gallium/Arsenic combination or silicon material could also be used. Additionally, and as shown in FIG. 4, the mid-wave detector layer 36 is located between the stratum 39 and the long-wave detection layer 38.

The aforementioned first pixel filter 30 is located right over the first pixel 26. The first filter allows passage of IR radiation up to nine microns ($\lambda$=9 µm) to pass through and illuminate first pixel 26. Since the mid-wave detection layer 36 absorbs radiation out to 7 µm, the first pixel LWIR output is between seven and nine microns, $\lambda$=7–9 µm. Thus, the mid-wave detector layer and first filter cooperate to provide a first pixel output in the $L_1$ band, as represented by line 44, to the ROIC 20.

The device of the present invention also includes the above described second pixel filter 32, which is positioned over second pixel 28. The second pixel filter allows passage of certain IR radiation therethrough, including IR radiation having a wavelength up to ten microns ($\lambda$=10 µm). Stated differently, the second filter allows the $L_1$ band and the $L_2$ band to pass therethrough and illuminate second pixel 28. As LWIR radiation in the $L_1+L_2$ band passes therethrough, it is detected by the long-wave detection layer 38. The long-wave detector layer provides an intermediate output from the second pixel 28, designated by line 46, to ROIC 20. A differencing amplifier (not shown) in the ROIC electronically differences the $L_1+L_2$ intermediate output from the second pixel from the $L_1$ output from the first pixel (in a manner known in the art) to yield a second LWIR output that is entirely within in the $L_2$ band ($\lambda$=9–10 µm).

As described above, the differencing amplifier provides a second pixel output in the $L_2$ band by subtracting the first pixel output from the intermediate output (depicted by reference character 46 in FIG. 4) of the second pixel, or by differencing output of adjacent pixels. It should be appreciated, however, that when the pixels in the substrate are considered together as a focal plane array (FPA), a single differencing amplifier could receive the total intermediate input of all the second pixels in the FPA and subtract the aggregate first input from the first pixels to yield a second pixel output with one differencing amplifier. In fact, this configuration would allow for electronic differencing as described above by a differencing amplifier which is separate from the focal plane array (FPA) that is defined by the pixels. This "off-FPA" differencing would obviate the complex timing and routing considerations that are inherent for a configuration wherein a differencing amplifier is provided for each pixel group.

Figure 5:
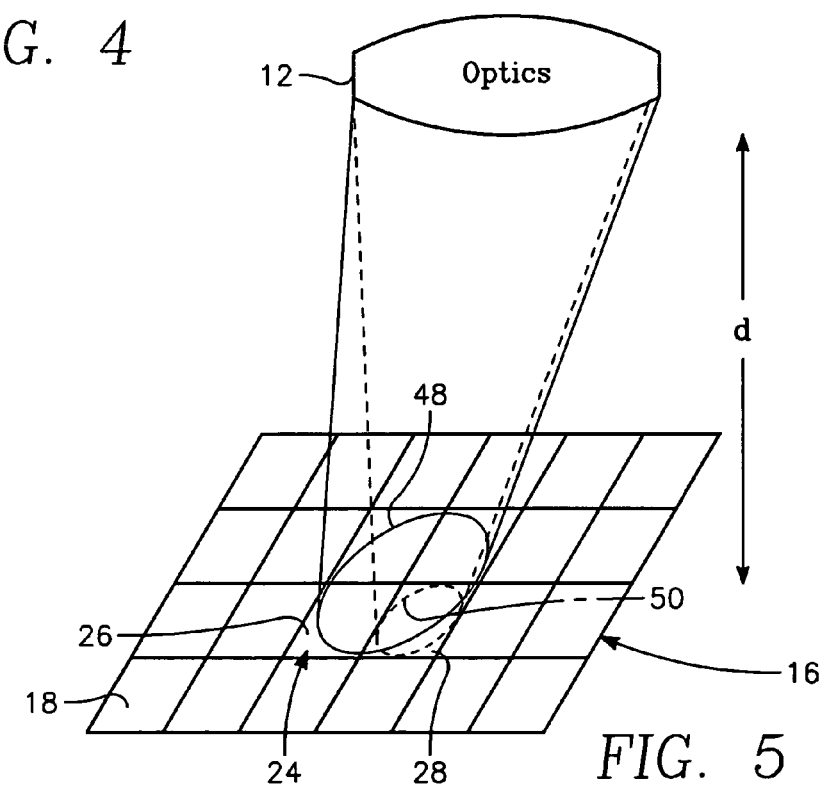
FIG. 5 is an isometric view that illustrates the spatial relationship between the optics and the focal plane array, as well the generated LWIR and MWIR spot sizes on the substrate during operation of the IR imaging device.

By cross-reference of FIGS. 1, 2, 3A and 4, it can be seen the first filter and second filter (along with the respective first and second pixels that they are positioned over) are arranged on focal plane array in a checkerboard pattern. Keeping this structure in mind, and referring now to FIG. 5, the positioning of the substrate relative to optics 12 is now described. Specifically, the focal plane array is spaced-apart from the optics by a predetermined distance "d", that is chosen according to the focal length for MWIR radiation. The optics should be designed such that the size (area) of the MWIR spot 50 resulting from a point source in space matches the area of a pixel 18, either of first pixel 26 or second pixel 28 (first pixels 26 and second pixels 28 have the same dimensions and are of equal area). If the focal length for LWIR radiation is designed to be the same, the size of the resulting LWIR spot 48 will be larger and cover approximately four pixels for a diffractive limited system. If the area of the LWIR spot 48 is about the same as the area of a pixel group 24, then LWIR radiation can be detected and processed as described above. Moreover, two separate LWIR bands, the $L_1$ and $L_2$ band, can be generated with the above-described structure.

With this structure a MWIR image and a LWIR $L_1$ image and a LWIR $L_2$ image can be simultaneously obtained with the maximum resolution permitted by the optics. The LWIR images will have lower resolution than the MWIR image, but that is inevitable due to diffraction effects.

While the multi-color IR imaging device of the present invention, as herein shown and disclosed in detail, is fully capable of obtaining the objects and providing the advantages above stated, it is to be understood that the presently preferred embodiments are merely illustrative of the invention. As such, no limitations are intended other than as defined in the appended claims.

What is claimed is:

1. A multi-color infrared (IR) imaging device comprising:
   a focal plane array for detecting both MWIR and LWIR, said focal plane array having at least a first set of pixels and a second set of pixels defining a pixel group, each of said sets of pixels having a pixel area, said pixel group having a pixel group area;
   said first set of pixels further comprising a first pixel, a first pixel filter, a first stratum, a first MWIR detector layer and a first LWIR detector layer, said first pixel being coupled to an integrated circuit;
   said second set of pixels further comprising a second pixel, a second pixel filter, a second stratum, a second MWIR detector layer and a second LWIR detector layer, said second pixel being coupled to said integrated circuit;
   optics for simultaneously directing said MWIR and said LWIR in focus onto said focal plane array, said MWIR defining an M band, said LWIR defining an $L_1$ band and an $L_2$ band;
   an inhomogeneous filter, comprising said first pixel filter and said second pixel filter, overlaid on the focal plane array so that said M band and said $L_1$ band pass through to said first set of pixels, and further said inhomogeneous filter passes said M band, said $L_1$ band and said $L_2$ band to said second set of pixels; said optics establishing an MWIR spot size and an LWIR spot size, said focal plane array being spaced-apart from said optics by a predetermined distance chosen according to a focal length for said MWIR so that said MWIR spot size is about equal to said pixel area and said LWIR spot size is about equal to said pixel group area;
   said first set of pixels generate a first pixel output that includes said $L_1$ band;
   said second set of pixels generate a second pixel output that includes said $L_1$ band and said $L_2$ band;
   a multiple amount of said first set of pixels and said second set of pixels being placed on said focal plane array; and
   said first pixel outputs and said second pixel outputs generate a radiation map converted into a plurality of electric impulses read by said integrated circuit, said integrated circuit provides a high-resolution color infrared image to a means for display.

2. The device of claim 1, further comprising:
   said integrated circuit being a read-only integrated circuit board; and
   said first MWIR detector layer, said first LWIR detector layer, said second MWIR detector layer and said second LWIR detector layer being grown by epitaxial techniques.

3. The device of claim 2 further comprising a means for isolating said $L_2$ band from said second pixel output.

4. The device of claim 3 wherein said isolating means is a differencing amplifier.

5. A device for simultaneous multi-color imaging MWIR and LWIR, comprising:
   a focal plane array defining a plurality of pixels, said plurality being divided into a first set of pixels and a second set of pixels arranged in a checkerboard pattern, each of said sets of pixels having a pixel area;
   said first set of pixels further comprising a first pixel, a first pixel filter, a first stratum, a first MWIR detector layer and a first LWIR detector layer, said first pixel being coupled to an integrated circuit;
   said second set of pixels further comprising a second pixel, a second pixel filter, a second stratum, a second MWIR detector layer and a second LWIR detector layer, said second pixel being coupled to said integrated circuit;
   optics for simultaneously directing said MWIR and said LWIR in focus onto said focal plane array;
   an inhomogeneous filter, comprising said first pixel filter and said second pixel filter, overlaid on said focal plane array allowing said MWIR radiation and a first portion of said LWIR to pass through to said first set of pixels, and further allowing said MWIR and a second portion of the LWIR band to pass through to said second set of pixels;
   said optics establishing an MWIR focal length and an LWIR focal length equal to said MWIR focal length, said focal plane array being spaced-apart from said optics by a predetermined distance chosen according to said MWIR focal length to establish an MWIR spot size about equal to said pixel area, and further to establish an LWIR spot size equal to a combined area of four adjacent pixels, wherein said LWIR spot size is incident on two pixels from said first set of pixels and two pixels from said second set of pixels;
   said first set of pixels generate a first pixel output that includes an $L_1$ band;
   said second set of pixels generate a second pixel output that includes said $L_1$ band and an $L_2$ band;

a means for isolating said $L_2$ band from said second pixel output;

a multiple amount of said first set of pixels and said second set of pixels being placed on said focal plane array; and said first pixel outputs and said second pixel outputs generate a radiation map converted into a plurality of electric impulses read by said integrated circuit, said integrated circuit provides a high-resolution color infrared image to a means for display.

6. The device of claim 5 wherein said inhomogeneous filter comprises a plurality of said first pixel filters and a plurality of said second pixel filters.

7. The device of claim 6 wherein said each of said first pixel filters corresponds to one pixel from said first set of pixels, and each of said second pixel filters corresponds to one pixel from said second set of pixels.

8. The device of claim 5 wherein said inhomogeneous filter comprises a plurality of first stripe filters and a plurality of second stripe filters.

9. The device of claim 8 wherein said first stripe filters and said second stripe filters correspond to alternating rows of said pixels.

10. A method for simultaneously imaging both MWIR and LWIR in multiple colors, comprising the steps of:

forming a first set of pixels with a first pixel, a first pixel filter, a first stratum, a first MWIR detector layer and a first LWIR detector layer, said first pixel being coupled to an integrated circuit;

forming a second set of pixels with a second pixel, a second pixel filter, a second stratum, a second MWIR detector layer and a second LWIR detector layer, said second pixel being coupled to said integrated circuit;

providing a focal plane array having said first set of pixels and said second set of pixels, said first set of pixels and said second set of pixels defining a pixel group, said first pixel and said second pixel each having a pixel area;

positioning optics for simultaneously directing said MWIR and said LWIR in focus onto said focal plane array;

overlaying an inhomogeneous filter, comprising said first pixel filter and said second pixel filter, on said focal plane array;

placing said first pixel filter between said first pixel and said optics to allow an M MWIR band and an $L_1$ LWIR band to pass through to said first set of pixels;

laying said second filter between said second pixel and said optics to allow said M band, said $L_1$ band and an $L_2$ LWIR band to pass through to said second set of pixels;

spacing said focal plane array apart from said optics by a predetermined distance corresponding to an MWIR focal length to establish an MWIR spot size about equal in size to said pixel area;

receiving a first pixel output and a second pixel output in said integrated circuit, said first pixel output including said $L_1$ band and said second pixel output including said $L_1$ band and said $L_2$ band;

isolating said $L_2$ band from said second pixel output;

generating a radiation map from said first pixel output and said second pixel output;

placing a multiple number of said first set of pixels and said second set of pixels on said focal plane array;

converting said radiation map into a plurality of electric impulses read by said integrated circuit; and displaying a high-resolution color infrared image on a means for display.

11. The method of claim 10 wherein:

said pixels define a pixel group with a pixel group area; and said spacing-apart step establishes a LWIR spot size about equal to a pixel group area.

* * * * *